United States Patent
Walther et al.

(10) Patent No.: US 7,132,672 B2
(45) Date of Patent: Nov. 7, 2006

(54) FARADAY DOSE AND UNIFORMITY MONITOR FOR PLASMA BASED ION IMPLANTATION

(75) Inventors: Steven R. Walther, Andover, MA (US); Rajesh Dorai, Rockport, MA (US); Harold Persing, Rockport, MA (US); Jay Scheuer, Rowley, MA (US); Bon-Woong Koo, Andover, MA (US); Bjorn O. Pedersen, Chelmsford, MA (US); Chris Leavitt, Gloucester, MA (US); Timothy Miller, South Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 33 days.

(21) Appl. No.: 10/817,755

(22) Filed: Apr. 2, 2004

(65) Prior Publication Data

US 2005/0223991 A1 Oct. 13, 2005

(51) Int. Cl.
*H01J 37/244* (2006.01)

(52) U.S. Cl. ............... 250/492.3; 250/492.21; 250/397; 327/71.3; 327/72; 118/723 E; 118/723; 438/513; 438/723

(58) Field of Classification Search ............... None
See application file for complete search history.

(56) References Cited

U.S. PATENT DOCUMENTS

| | | | |
|---|---|---|---|
| 5,814,823 A | 9/1998 | Benveniste | 250/492.21 |
| 6,020,592 A * | 2/2000 | Liebert et al. | 250/492.21 |
| 6,050,218 A * | 4/2000 | Chen et al. | 118/723 E |
| 2003/0101935 A1* | 6/2003 | Walther | 118/723 E |
| 2003/0222227 A1 | 12/2003 | Richards et al. | 250/492.21 |

FOREIGN PATENT DOCUMENTS

| | | |
|---|---|---|
| EP | 0 994 203 A2 | 4/2000 |
| JP | 61227357 | 10/1986 |

* cited by examiner

*Primary Examiner*—Jack Berman
*Assistant Examiner*—Zia R. Hashmi
(74) *Attorney, Agent, or Firm*—Foley Hoag LLP

(57) ABSTRACT

A Faraday dose and uniformity monitor can include a magnetically suppressed annular Faraday cup surrounding a target wafer. A narrow aperture can reduce discharges within Faraday cup opening. The annular Faraday cup can have a continuous cross section to eliminate discharges due to breaks. A plurality of annular Faraday cups at different radii can independently measure current density to monitor changes in plasma uniformity. The magnetic suppression field can be configured to have a very rapid decrease in field strength with distance to minimize plasma and implant perturbations and can include both radial and azimuthal components, or primarily azimuthal components. The azimuthal field component can be generated by multiple vertically oriented magnets of alternating polarity, or by the use of a magnetic field coil. In addition, dose electronics can provide integration of pulsed current at high voltage, and can convert the integrated charge to a series of light pulses coupled optically to a dose controller.

37 Claims, 8 Drawing Sheets

FARADAY DOSE AND UNIFORMITY MONITOR FOR PLASMA BASED ION IMPLANTATION

BACKGROUND (1) Field

The disclosed methods and systems relate generally to plasma doping systems used for ion implantation of workpieces and, more particularly, to methods and apparatus for measuring the dose and uniformity of the dose implanted into the workpiece.

(2) Description of Relevant Art

Ion implantation is a standard technique for introducing conductivity-altering impurities into semiconductor wafers. In a conventional ion implantation system, a desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

In some applications, it is necessary to form shallow junctions in a semiconductor wafer, where the impurity material is confined to a region near the surface of the wafer. In these applications, the high energy acceleration and the related beam forming hardware of conventional ion implanters are unnecessary. Accordingly, it has been proposed to use plasma doping systems for forming shallow junctions in semiconductor wafers. In a plasma doping system, a semiconductor wafer is placed on a conductive platen which functions as a cathode. An ionizable gas containing the desired dopant material is introduced into the chamber, and a high voltage pulse is applied between the platen and an anode or the chamber walls, causing formation of a plasma having a plasma sheath in the vicinity of the wafer. The applied voltage causes ions in the plasma to cross the plasma sheath and to be implanted into the wafer. The depth of implantation is related to the voltage applied between the wafer and the anode. A plasma doping system is described in U.S. Pat. No. 5,354,381 issued Oct. 11, 1994 to Sheng.

In the plasma doping system described above, the high voltage pulse generates a plasma and accelerates positive ions from the plasma toward the wafer. In other types of plasma systems, known as plasma immersion systems, a continuous plasma, typically generated by applying radio frequency (RF) power, is sustained between the platen and the anode. At intervals, a high voltage pulse is applied between the platen and the anode, causing positive ions in the plasma to be accelerated toward the wafer.

Exacting requirements are placed on semiconductor fabrication processes involving ion implantation with respect to the cumulative ion dose implanted into the wafer and dose uniformity across the wafer surface. The implanted dose determines the electrical activity of the implanted region, while dose uniformity is required to ensure that all devices on the semiconductor wafer have operating characteristics within specified limits. Accurate measurement of the ion current impacting the target or wafer is required to control the implantation process time so as to obtain a repeatable ion implantation dose, without degrading the process performance. The measurement is complicated by the fact that it must be performed at or very near the ion implantation target, which is being pulsed with a negative DC bias to accomplish the implantation of positive ions from the plasma. Consequently, the ion current signal information, which is measured at a high potential, must be coupled to ground voltage for use by a control system that is controlling the implant process time. Ideally, the uniformity measurement can be incorporated into the ion current measurement structure.

One prior art approach to dose measurement in plasma doping systems involves measurement of the current delivered to the plasma by the high voltage pulses, as described in the aforementioned U.S. Pat. No. 5,354,381. However, this approach is subject to inaccuracies. The measured current includes electrons generated during ion implantation and excludes neutral molecules that are implanted into the workpiece, even though these neutral molecules contribute to the total dose. Furthermore, since the measured current passes through the wafer being implanted, it is dependent on the characteristics of the wafer, which may produce errors in the measured current. Those characteristics include emissivity, local charging, gas emission from photoresist on the wafer, etc. Thus, different wafers give different measured currents for the same ion dose. In addition, the measured current pulses include large capacitive or displacement current components which may introduce errors in the measurement.

A technique for plasma doping dosimetry is described by E. Jones et al. in IEEE Transactions on Plasma Science, Vol. 25, No. 1, February 1997, pp. 42–52. Measurements of implanter current and implant voltage are used to determine an implant profile for a single implant pulse. The implant profile for a single pulse is used to project the final implant profile and total implanted dose. This approach is also subject to inaccuracies, due in part to the fact that it depends on power supply and gas control stability to ensure repeatability. Furthermore, the empirical approach is time consuming and expensive.

In conventional ion implantation systems which involve the application of a high energy beam to the wafer, cumulative ion dose is typically measured by a Faraday cup, or Faraday cage, positioned in front of the target wafer. The Faraday cage is typically a conductive enclosure, often with the wafer positioned at the downstream end of the enclosure and constituting part of the Faraday system. The ion beam passes through the Faraday cage to the wafer and produces an electrical current in the Faraday. The Faraday current is supplied to an electronic dose processor, which integrates the current with respect to time to determine the total ion dosage. The dose processor may be part of a feedback loop that is used to control the ion implanter.

Various Faraday cage configurations for ion implanters have been disclosed in the prior art. Faraday cages positioned in front of semiconductor wafers are disclosed in U.S. Pat. No. 4,135,097 issued Jan. 16, 1979 to Forneris et al; U.S. Pat. No. 4,433,247 issued Feb. 21, 1984 to Turner; U.S. Pat. No. 4,421,988 issued Dec. 20, 1983 to Robertson et al; U.S. Pat. No. 4,463,255 issued Jul. 31, 1984 to Robertson et al; U.S. Pat. No. 4,361,762 issued Nov. 30, 1982 to Douglas; U.S. Pat. No. 4,786,814 issued Nov. 22, 1988 to Kolondra et al; and U.S. Pat. No. 4,595,837 issued Jun. 17, 1986 to Wu et al. Faraday cages positioned behind a rotating disk are disclosed in U.S. Pat. No. 4,228,358 issued Oct. 14, 1980 to Ryding; U.S. Pat. No. 4,234,797 issued Nov. 18, 1980 to Ryding; and U.S. Pat. No. 4,587,433 issued May 6, 1986 to Farley.

Dose and dose uniformity have also been measured in conventional high energy ion implantation systems using a corner cup arrangement as disclosed in U.S. Pat. No. 4,751,393 issued Jun. 14, 1988 to Corey, Jr. et al. A mask having a central opening is positioned in the path of the ion beam.

The beam is scanned over the area of the mask with the portion passing through the central opening impinging on the wafer. Small Faraday cups are located at the four corners of the mask and sense the beam current at these locations.

Other Faraday cup configurations are described in U.S. Pat. No. 6,050,218 issued Apr. 18, 2000 to Chen, et al., U.S. Pat. No. 6,101,971 issued Aug. 15, 2000 to Denholm, et al., and U.S. Pat. No. 6,020,592 issued Feb. 1, 2000 to Liebert, et al. Chen et al. and Denholm et al. describe the use of electrostatic suppression for a Faraday cup, which can cause particle contamination through "micro-arcing". Liebert et al. describe the use of a magnetic field positioned between a mask and an entrance to a Faraday cup to provide magnetic suppression of secondary electrons. However, magnetic field perturbations can result in measurement errors.

SUMMARY

The systems and methods disclosed herein can include a plasma doping system having a plasma doping chamber, a generally circular platen mounted in the plasma doping chamber for supporting a workpiece such as a semiconductor wafer, a source of ionizable gas coupled to the chamber, an anode spaced from the platen and a pulse source for applying high voltage pulses between the platen and the anode. The high voltage pulses produce a plasma having a plasma sheath in the vicinity of the workpiece. The high voltage pulses accelerate positive ions across the plasma sheath toward the platen for implantation into the workpiece. The plasma doping apparatus includes at least one annular Faraday cup positioned adjacent to and surrounding the platen for collecting a sample of the positive ions accelerated across the plasma sheath. The sample is representative of the dose of positive ions implanted into the workpiece.

The width and thickness of the aperture and the depth of the Faraday cup are such as to provide a shallow and narrow Faraday, which can reduce discharges within the opening. The ion collection electrode of the Faraday cup can have a continuous azimuthal cross section, which can eliminate discharges due to interruptions in azimuthal symmetry. Plasma and implant perturbations can be minimized by using a magnetic suppression field having a very rapid decrease in field strength with distance, which can be accomplished by having the north and south poles in close proximity to each other.

The field can be generally oriented radially across the collection electrode, but the suppression magnets can provide an alternating azimuthal magnetic field component so as to rotate the radial orientation in opposite directions for adjacent magnets, which can reduce the secondary electron mean free path. The magnetic suppression field can include a field with both radial and azimuthal components, or with primarily azimuthal components. The azimuthal field component can be generated by multiple vertically oriented magnets of alternating polarity, or by the use of a magnetic field coil, e.g., by the use of the return field of a solenoid. Both azimuthal and radial components can be generated by multiple horizontally oriented magnets with alternately canted poles, such that the generally radial polar orientation results in a force on the electrons that is primarily azimuthal, while the canting results in a radial component. As used herein, radial and azimuthal directions refer to generally horizontal directions with respect to the platen or wafer.

The Faraday aperture can have independently measured openings at different radii. Differences in the current density at different radii can be used to monitor changes in plasma uniformity. In addition, dose electronics can provide integration of pulsed current at high voltage, and can convert the integrated charge to a series of light pulses coupled optically to a dose controller.

In one embodiment, a plasma doping apparatus can include a plasma doping chamber, a platen mounted in the plasma doping chamber for supporting a workpiece, a source of ionizable gas containing a desired dopant for implantation into the workpiece and coupled to the chamber, a plasma source for producing a plasma having a plasma sheath in the vicinity of the workpiece, the plasma containing positive ions of the ionizable gas and the the plasma source accelerating the positive ions across the plasma sheath toward the platen for implantation into the workpiece, an annular Faraday cup disposed around the platen for collecting a sample of the positive ions accelerated across said plasma sheath, with the sample being representative of the number of positive ions implanted into the workpiece, and a magnetic field generating means positioned to generate a magnetic field at a collecting surface of the Faraday cup for suppressing the escape of secondary electrons from the Faraday cup.

In one aspect, the apparatus can include a plurality of vertically aligned magnets of alternating polarity positioned beneath the collecting surface. The magnetic field can be oriented azimuthal and generally parallel to the collecting surface for directing the secondary electrons radially towards a sidewall of the Faraday cup. A field coil magnet, or a plurality of horizontally aligned magnets positioned beneath the collecting surface can generate the magnetic field. The horizontally aligned magnets can have azimuthally alternating polarity to generate a magnetic field having azimuthal components generally parallel to the collecting surface. The horizontally aligned magnets can be formed of pairs of horizontally aligned magnets of the same polarity. The magnetic field can be oriented radial and parallel to the collecting surface for directing said secondary electrons azimuthally within the Faraday cup. The magnetic field can have an azimuthal component.

In one aspect, a plurality of horizontally aligned magnets can generate a magnetic field oriented radial and generally parallel to the collecting surface, with one or more of the magnets generating a magnetic field with an azimuthal component. The magnets generating a magnetic field with an azimuthal component can form an angle with respect to a tangent to a radius of the annular Faraday cup and alternating ones of the magnets can form supplementary angles with respect to the tangent.

The apparatus can include a shield ring disposed around the platen, and the Faraday cup can be positioned within the shield ring. The shield ring can have one or more horizontal projections extending over an opening of the Faraday cup to decrease an effective width of the opening. The width of the collecting surface of the Faraday cup can be greater than a width of the opening of the Faraday cup. The width between sidewalls of the Faraday cup can increase with increasing depth of the Faraday cup by tapering at least one of the sidewalls.

The apparatus can include magnetic shielding positioned to reduce the magnetic field generated at the workpiece and configured to intensify the magnetic field in the Faraday cup. The magnetic shielding can be configured in the shape of a pair of channels with webs extending generally parallel to sidewalls of the Faraday cup and flanges extending in a direction towards an opening of said Faraday cup. In one aspect, the magnetic shielding can include a pair of plates positioned parallel to sidewalls of the Faraday cup and oppositely about an opening of the Faraday cup.

In one embodiment to a plasma doping apparatus that includes having a plasma doping chamber, a platen mounted in the plasma doping chamber for supporting a workpiece, a source of ionizable gas coupled to the chamber, the ionizable gas containing a desired dopant for implantation into the workpiece, and a plasma source for producing a plasma having a plasma sheath in the vicinity of the workpiece, the plasma containing positive ions of the ionizable gas, and accelerating the positive ions across the plasma sheath toward the platen for implantation into the workpiece, an improvement to the apparatus can include an annular Faraday cup disposed around the platen for collecting a sample of the positive ions accelerated across the plasma sheath, the sample being representative of the number of positive ions implanted into the workpiece, and a magnetic field generating means to generate a magnetic field at a collecting surface of the Faraday cup for suppressing escape of secondary electrons from said Faraday cup.

In one embodiment, a Faraday cup disposed adjacent a platen in a plasma doping apparatus for collecting a sample of positive ions accelerated across a plasma sheath can include a magnetic field generating means positioned to generate a magnetic field at a collecting surface of said Faraday cup for suppressing escape of secondary electrons from said Faraday cup.

In one embodiment, a method a method of monitoring a dose of positive ions implanted into the workpiece in a plasma doping apparatus having a plasma doping chamber, a platen mounted in the plasma doping chamber for supporting the workpiece, a source of ionizable gas containing a desired dopant for implantation into the workpiece and coupled to the chamber, and a plasma source for producing a plasma having a plasma sheath in the vicinity of the workpiece, the method including collecting a sample of positive ions accelerated across the plasma sheath with an annular Faraday cup positioned adjacent to the platen, the sample being representative of a number of positive ions implanted into the workpiece, and generating a magnetic field in close proximity to a collecting surface of the Faraday cup to suppress escape of secondary electrons from the Faraday cup.

Other objects and advantages will become apparent hereinafter in view of the specification and drawings.

DESCRIPTION

Figure 1:
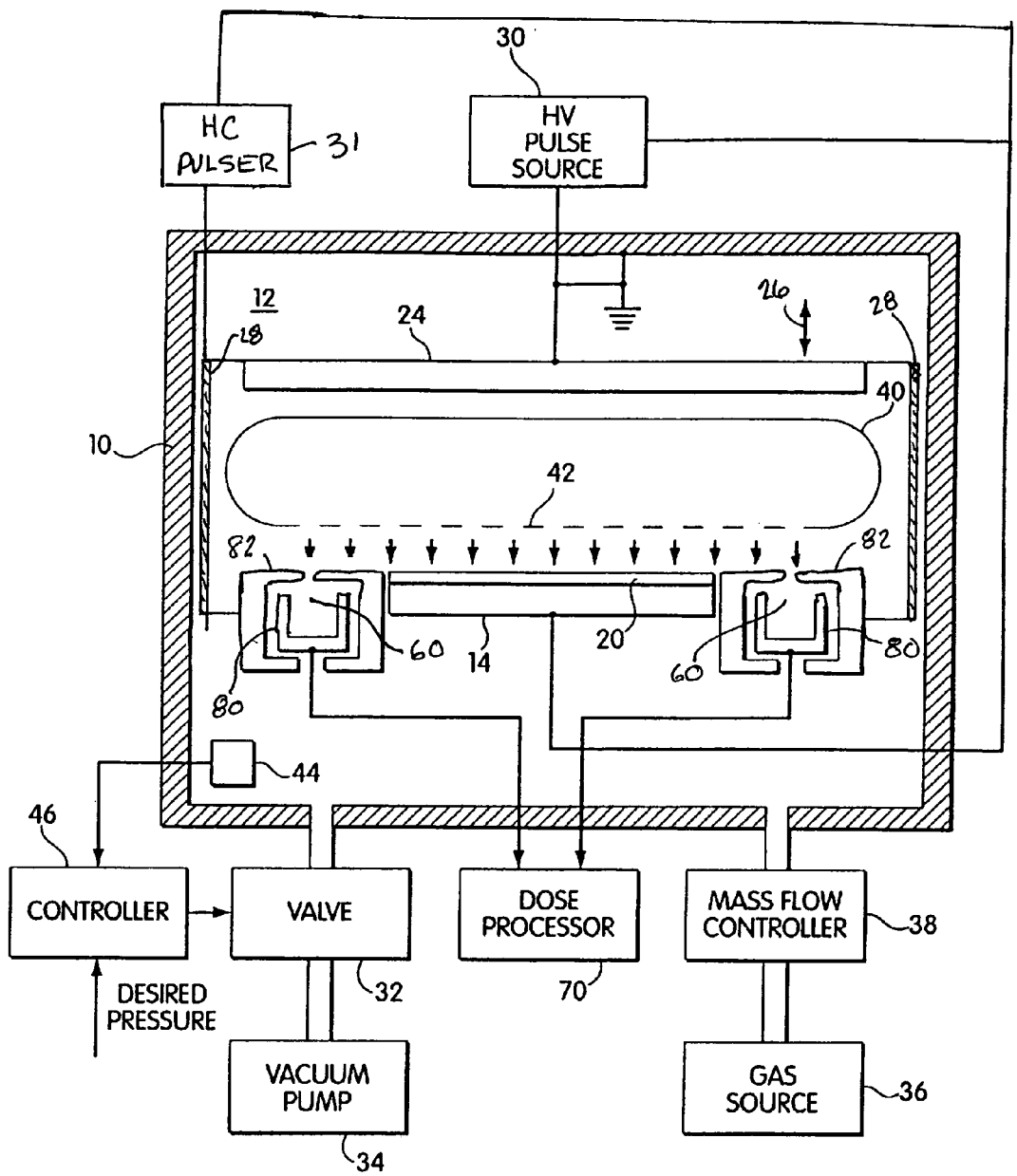
FIG. 1 illustrates a schematic representation of an exemplary plasma doping system.

To provide an overall understanding, certain illustrative embodiments will now be described; however, it will be understood by one of ordinary skill in the art that the systems and methods described herein can be adapted and modified to provide systems and methods for other suitable applications and that other additions and modifications can be made without departing from the scope of the systems and methods described herein.

Unless otherwise specified, the illustrated embodiments can be understood as providing exemplary features of varying detail of certain embodiments, and therefore, unless otherwise specified, features, components, modules, and/or aspects of the illustrations can be otherwise combined, separated, interchanged, and/or rearranged without departing from the disclosed systems or methods. Additionally, the shapes and sizes of components are also exemplary and unless otherwise specified, can be altered without affecting the disclosed systems or methods.

The disclosure includes a magnetically suppressed Faraday cup surrounding the substrate or target wafer. The width and thickness of the aperture and the depth of the Faraday cup are such as to provide a shallow and narrow Faraday, which can reduce discharges within the opening. The ion collection electrode of the Faraday cup can have an azimuthally continuous cross section, which can eliminate discharges due to interruptions in azimuthal symmetry. The Faraday aperture can have independently measured openings at different radii. Differences in the current density at different radii can be used to monitor changes in plasma uniformity. In addition, dose electronics can provide integration of pulsed current at high voltage, and can convert the integrated charge to a series of light pulses coupled optically to a dose controller.

Magnetically induced plasma and implant perturbations can be minimized by using a magnetic suppression field having a very rapid decrease in field strength with distance. The magnets forming the suppression field can have their north and south poles in close proximity to each other. The field can be generally oriented radially across the collection electrode, but the suppression magnets can have alternating polarity so as to rotate the radial orientation in opposite directions for adjacent magnets, which can reduce the secondary electron mean free path. The magnetic suppression field can include a field with both radial and azimuthal components, or with primarily azimuthal components. The azimuthal field component can be generated by multiple vertically oriented magnets of alternating polarity, or by the use of a magnetic field coil, e.g., by the use of the return field of a solenoid. Both azimuthal and radial components can be generated by multiple horizontally oriented magnets with alternately canted poles, such that the generally radial polar orientation results in a force on the electrons that is primarily azimuthal, while the canting results in a radial component.

FIG. 1 schematically illustrates an exemplary plasma doping system in accordance with the above description. A plasma doping chamber 10 defines an enclosed volume 12. A platen 14 positioned within chamber 10 provides a surface for holding a workpiece, such as a semiconductor wafer 20. The wafer 20 may, for example, be clamped at its periphery to a flat surface of platen 14. The platen 14 supports wafer 20 and provides an electrical connection to wafer 20. In one embodiment, the platen has an electrically-conductive surface for supporting wafer 20. In another embodiment, the platen includes conductive pins for electrical connection to wafer 20.

An anode 24 is positioned within chamber 10 in spaced relation to platen 14. Anode 24 may be movable in a direction, indicated by arrow 26, perpendicular to platen 14. The anode 24 is typically connected to electrically-conductive walls of chamber 10, both of which may be connected to ground. Hollow cathode 28 is positioned within chamber 10 and surrounds, and is spaced from, anode 24, platen 14 and wafer 20.

The wafer 20 and the anode 24 are connected to first high voltage pulse generator 30, so that wafer 20 functions as a cathode. The pulse generator 30 typically provides pulses in a range of about 20 to 20,000 volts, about 5 to 100 microseconds in duration and a pulse repetition rate of about 500 Hz to 20 KHz. The pulse parameter values are given by way of example only and other values and ranges can be contemplated within the scope of the invention. In addition, the hollow cathode 28 and the anode can be connected to second high voltage pulse generator 31, which can provide alternative means of producing a plasma for very low energy implants.

The enclosed volume 12 of chamber 10 is coupled through a controllable valve 32 to a vacuum pump 34. A gas source 36 is coupled through a mass flow controller 38 to chamber 10. A pressure sensor 44 located within chamber 10 provides a signal indicative of chamber pressure to a controller 46. The controller 46 compares the sensed chamber pressure with a desired pressure input and provides a control signal to valve 32. The control signal controls valve 32 so as to minimize the difference between the chamber pressure and the desired pressure. Vacuum pump 34, valve 32, pressure sensor 44 and controller 46 constitute a closed loop pressure control system. The pressure is typically controlled in a range of about one millitorr to about 500 millitorr, but is not limited to this range. Gas source 36 supplies an ionizable gas containing a desired dopant for implantation into the workpiece. Examples of ionizable gas include $BF_3$, $N_2$, Xe, Ne, He, Ar, $PF_5$, $PH_3$, $AsH_3$, $AsF_5$, $AsF_3$ and $B_2H_6$. Mass flow controller 38 regulates the rate at which gas is supplied to chamber 10. The configuration shown in FIG. 1 provides a continuous flow of process gas at a constant gas flow rate and constant pressure. The pressure and gas flow rate are preferably regulated to provide repeatable results.

In operation, wafer 20 is positioned on platen 14. Then the pressure control system, mass flow controller 38 and gas source 36 produce the desired pressure and gas flow rate within chamber 10. By way of example, the chamber 10 may operate with $BF_3$ gas at a pressure of 10 millitorr. The pulse generator 30 applies a series of high voltage pulses to wafer 20, causing formation of a plasma 40 between wafer 20 and anode 24. As known in the art, the plasma 40 contains positive ions of the ionizable gas from gas source 36. The plasma 40 further includes a plasma sheath 42 in the vicinity of platen 14. The electric field that is present between anode 24 and platen 14 during the high voltage pulse accelerates positive ions from plasma 40 across plasma sheath 42 toward platen 14. The accelerated ions are implanted into wafer 20 to form regions of impurity material. The pulse voltage is selected to implant the positive ions to a desired depth in wafer 20. The number of pulses and the pulse duration are selected to provide a desired dose of impurity material in wafer 20. The current per pulse is a function of pulse voltage, gas pressure and species and any variable position of the electrodes. For example, the cathode to anode spacing may be adjusted for different voltages.

Figure 2:
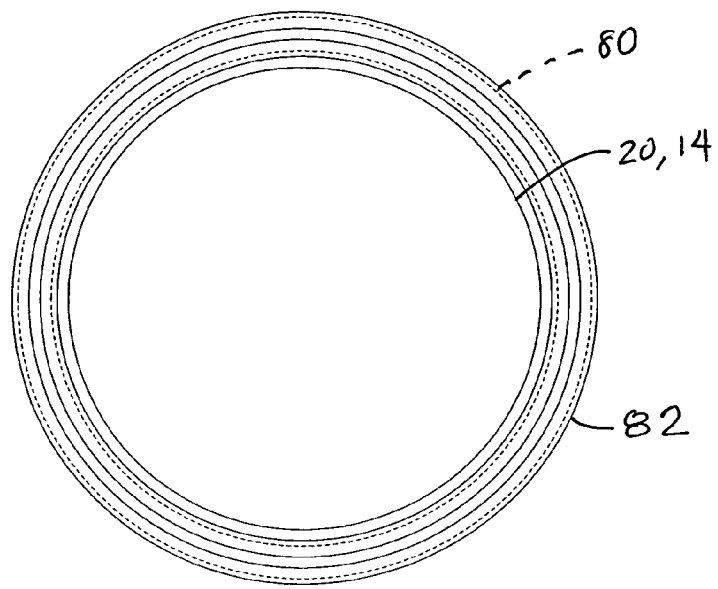
FIG. 2 illustrates a partial schematic plan view of the plasma doping system of FIG. 1.

Referring also to FIG. 2, which illustrates a partial schematic plan view of the plasma doping system of FIG. 1, annular Faraday cup 80 is positioned around wafer 20 and platen 14. The annular Faraday cup 80 has the advantage that localized variations in ion current are averaged around the periphery of wafer 20. Faraday cup 80 may be positioned in an annular shield ring 82. Faraday cup 80 is preferably located as close as is practical to wafer 20 and platen 14 and intercepts a sample of the positive ions accelerated from plasma 40 toward platen 14. However, Faraday cup 80 may have other positions relative to wafer 20 that provide a measurement representative of ion current implanted into wafer 20. Faraday cup 80 comprises a conductive enclosure having an entrance 60 facing plasma 40.

Faraday cup 80 is electrically connected to a dose processor 70 or other dose monitoring circuit. Positive ions entering Faraday cup 80 through entrance 60 produce a current in the electrical circuit connected to Faraday cup 80. The electrical current is indicative of the number of positive ions received per unit time, or ion current density. It is assumed that the ion current density received by Faraday cup 80 has a fixed relation to the number of ions implanted in wafer 20 per unit time. Depending on the uniformity of plasma 40 and the uniformity of ion acceleration toward platen 14, the ion current per unit area received by Faraday cup 80 may be substantially equal to or a fixed fraction of the ion current per unit area implanted in wafer 20. Since the electrical current output of Faraday cup 80 is representative of the ion current implanted in wafer 20, Faraday cup 80 provides a measurement of the ion dose implanted in wafer 20.

As indicated above, an electrical signal representative of ion current can be supplied from Faraday cup 80 to dose processor 70. In one embodiment, the electrical current from Faraday cup 80 can be supplied directly to dose processor 70 located external to chamber 10. In another embodiment, a preprocessing circuit (not shown) can be located in close proximity to platen 14 and can operate at the voltage of platen 14. The circuit can preprocess the output of Faraday cup 80 and supply a result to dose processor 70.

The total ion dose delivered to wafer 20 is the instantaneous ion current integrated over the time of the implant. The dose processor 70 typically can include a circuit for integrating the output of Faraday cup 80. The integrator can utilize conventional integrator circuits, charge sensitive amplifiers, or any other suitable circuit for performing the integration function. Dose processor configurations are known in connection with conventional ion implanters.

Shield ring 82 can surround platen 14 and can be biased to insure a relatively uniform distribution of implanted ions near the edge of wafer 20. As described previously, Faraday cup 80 can be positioned within shield ring 82 near the periphery of wafer 20 and platen 14. Side walls 84 of shield ring 82 can include horizontal projections 86, which extend over entrance 60 of Faraday cup 80 to effectively reduce the opening into Faraday cup 80. It has been found that secondary electrons can be produced by ions striking the sidewalls 88 of Faraday cup 80, which can cause discharges inside Faraday cup 80. Narrowing the opening can decrease the potential drop in Faraday cup 80, which can result in improved electron confinement in Faraday cup 80.

As an example, Faraday cup 80 opening 60 can have a width in the range of about 0.03 to 0.25 inches and a cup depth in the range of about 0.125 to 1.0 inches. For this exemplary Faraday cup, horizontal projections 86 of shield ring 82 extending over opening 60 such that the opening between projections 86 is in the range of 1/16" have been found to reduce discharges. The dimensions of Faraday cup 80, projections 86 and the opening between the projections 86 can depend on the operating characteristics of the ion implantation equipment. The aperture can be sized to limit electric field penetration into Faraday cup opening 60, such that variations in electrical potential can be well below the threshold for ionizing collisions, e.g., less than 10 eV.

Figure 3:
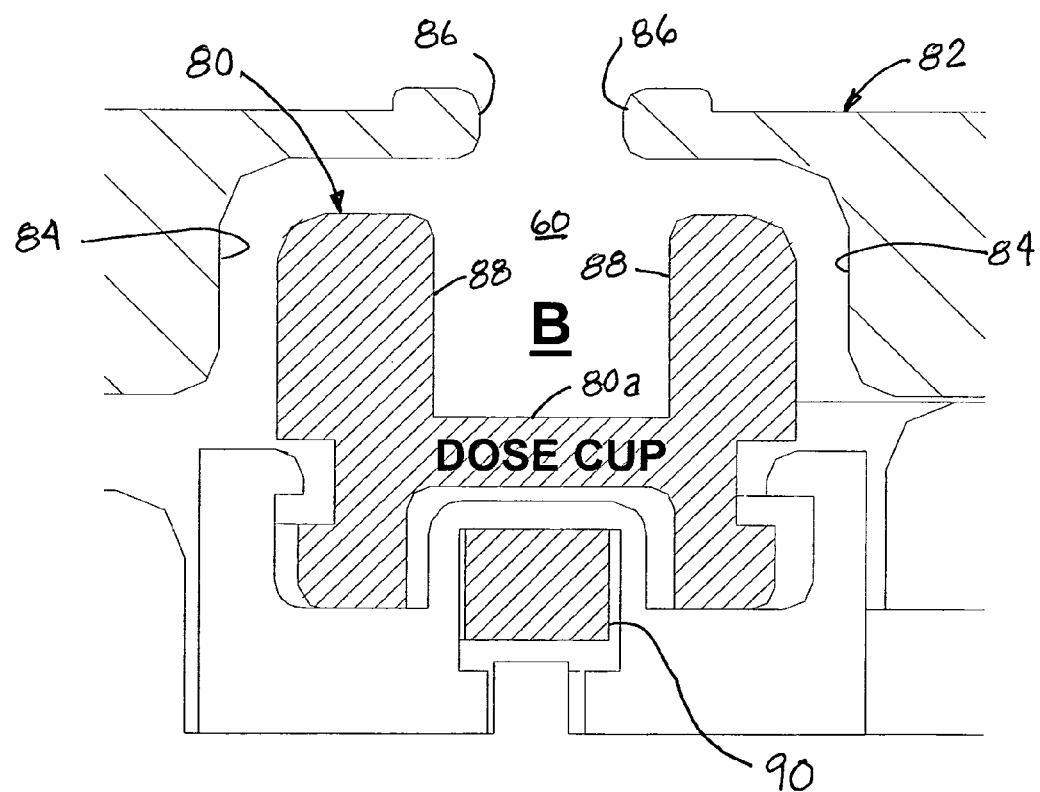
FIG. 3 illustrates a partial schematic cross-sectional view of a Faraday cup and shield ring.

Referring to FIG. 3, there is illustrated a partial schematic cross-sectional view of Faraday cup 80 and shield ring 82. Magnet 90 can be positioned below Faraday cup 80 to provide magnetic suppression of secondary electrons. The magnetic poles of magnet 90 can be in close proximity to each other to provide a magnetic suppression field having a very rapid decrease in field strength with distance, such that the residual field at the wafer 20 can be significantly reduced compared to current magnetic suppression configurations. For example, typical residual magnetic fields can be less than 5 Gauss for the configurations described herein.

Magnets 90 that can generate a magnetic field $\underline{B}$ in the range of about 100 to 2,000 Gauss, including Samarium-Cobalt (S–C) magnets or ceramic magnets, can produce the results described above. Individual magnets can be bar-shaped or cylindrically-shaped with dimensions ranging from 0.03 to 0.25 inches and a thickness ranging from 0.1 to 1.0 inches. The spacing between individual magnets 90 can range from 0.01 to 0.5 inches. Other ranges, shapes and materials can be contemplated, which can increase and/or decrease electron confinement and the residual field at the wafer 20. The cross-section of Faraday cup 80 shown in FIG. 3 can be continuous over the full annular Faraday cup 80, as seen in FIG. 2. At present, annular Faraday cups with magnetic suppression can include a number of breaks to prevent magnetron-type discharges inside the Faraday cup. As described further herein, the current design minimizes discharges without such interruptions in azimuthal symmetry.

Figure 4A:
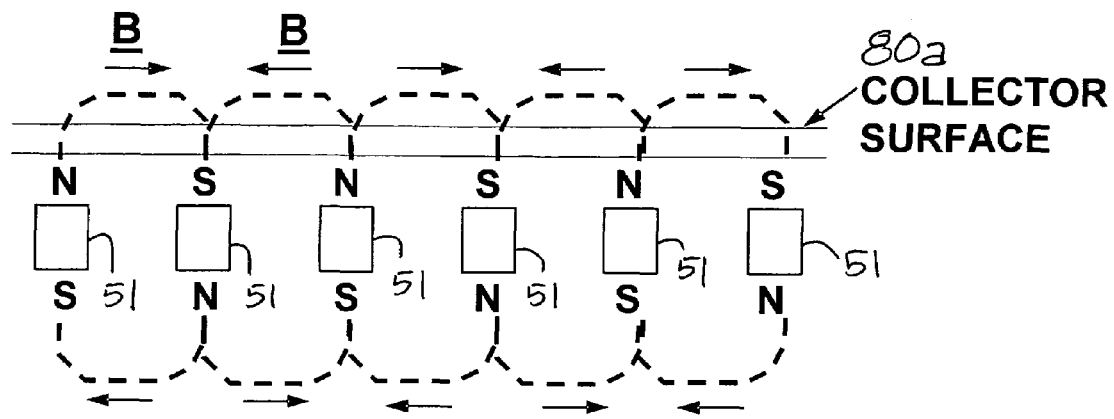
FIG. 4a schematically illustrates an arrangement of magnets below the collecting surface of a Faraday cup.
Figure 4B:
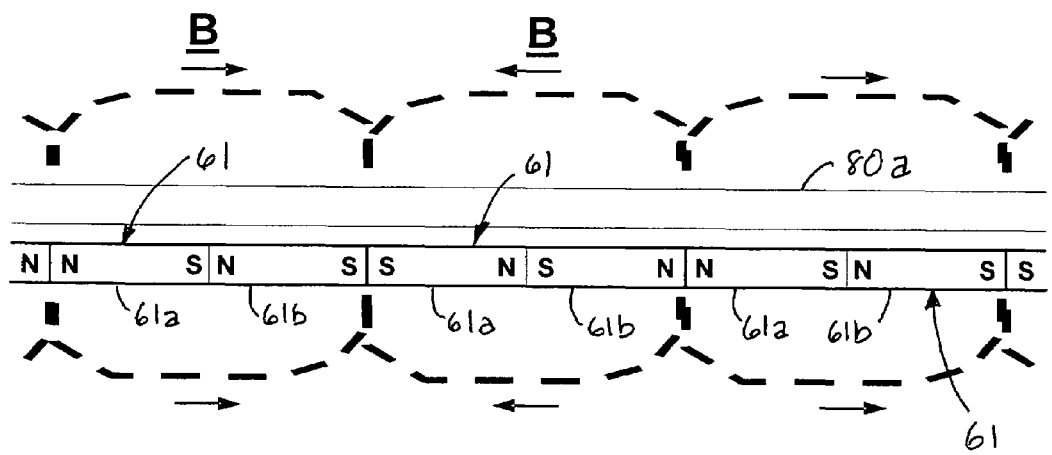
FIG. 4b schematically illustrates another arrangement of magnets below the collecting surface of a Faraday cup.

FIGS. 4a and 4b schematically illustrate arrangements of magnets below the collecting surface 80a of Faraday cup 80, and the resulting magnetic fields $\underline{B}$. For the embodiment of FIG. 4a, magnetic field $\underline{B}$ can be generated by a plurality of dot magnets 51, each having vertically aligned poles, and arranged along the centerline of Faraday cup 80, with alternating north and south poles. For the embodiment of FIG. 4b, magnetic field $\underline{B}$ can be generated by a plurality of magnets 61, each having horizontally aligned poles, and arranged along the centerline of Faraday cup 80, with alternating polarity. FIG. 4b illustrates magnets 61 as pairs of magnets 61a, 61b having the same polarity, though other arrangements of magnets and/or single magnets can be contemplated. By alternating the poles of magnets 51 and 61, magnets 51 and 61 can generate magnetic fields $\underline{B}$ having significant azimuthal components parallel to the collecting surface 80a. Additionally, the configurations shown in FIGS. 4a and 4b can redirect the motion of secondary electrons towards the sidewalls 88 of the collector to further improve electron confinement in Faraday cup 80.

Figure 5:
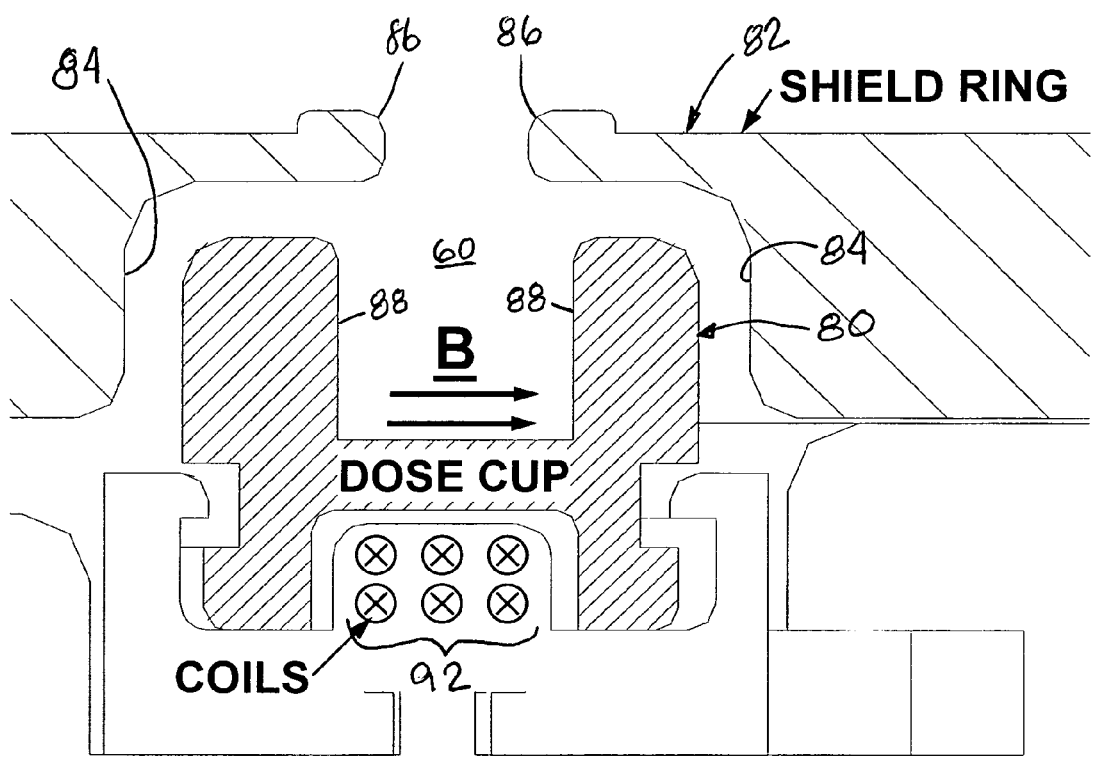
FIG. 5 illustrates a partial schematic cross-sectional view of a Faraday cup, shield ring and field coil magnet.

In another configuration, shown in FIG. 5, magnetic field $\underline{B}$ can be generated by magnetic field coil 92. In this configuration, magnetic field $\underline{B}$ is oriented radial and electron motion in $\underline{B}$ is azimuthal. While not providing the degree of electron confinement as the configuration shown in FIG. 4, the use of field coil 92 can still provide useful suppression of secondary electrons. The use of magnetic coil 92 can provide for varying the magnitude of the magnetic field by varying the current in coil 92. Additionally, coil 92 can provide a more uniform magnetic field when compared to arrangements having a finite set of magnets.

Figure 6:
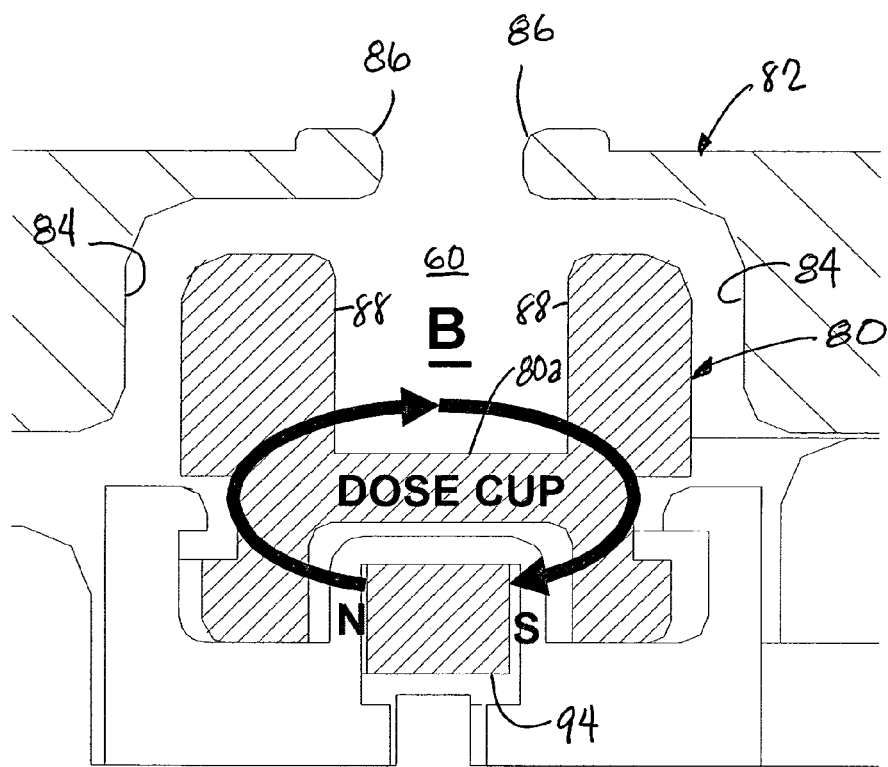
FIG. 6 illustrates a partial schematic cross-sectional view of a Faraday cup, shield ring and magnets for generating a radial magnetic field.

In another configuration, shown in FIG. 6, magnets 94 can be arranged along the centerline of Faraday cup 80, with alternating north and south poles aligned horizontally. As indicated, magnetic field $\underline{B}$ can be oriented radial and electron motion can be directed toward collector surface 80a. For primarily radial magnetic fields, as in FIGS. 5 and 6, the addition of a periodic or continuous azimuthally aligned magnetic field can act to inhibit magnetron-type discharges resulting from azimuthal electron-movement within annular Faraday cup 80.

Figure 7:
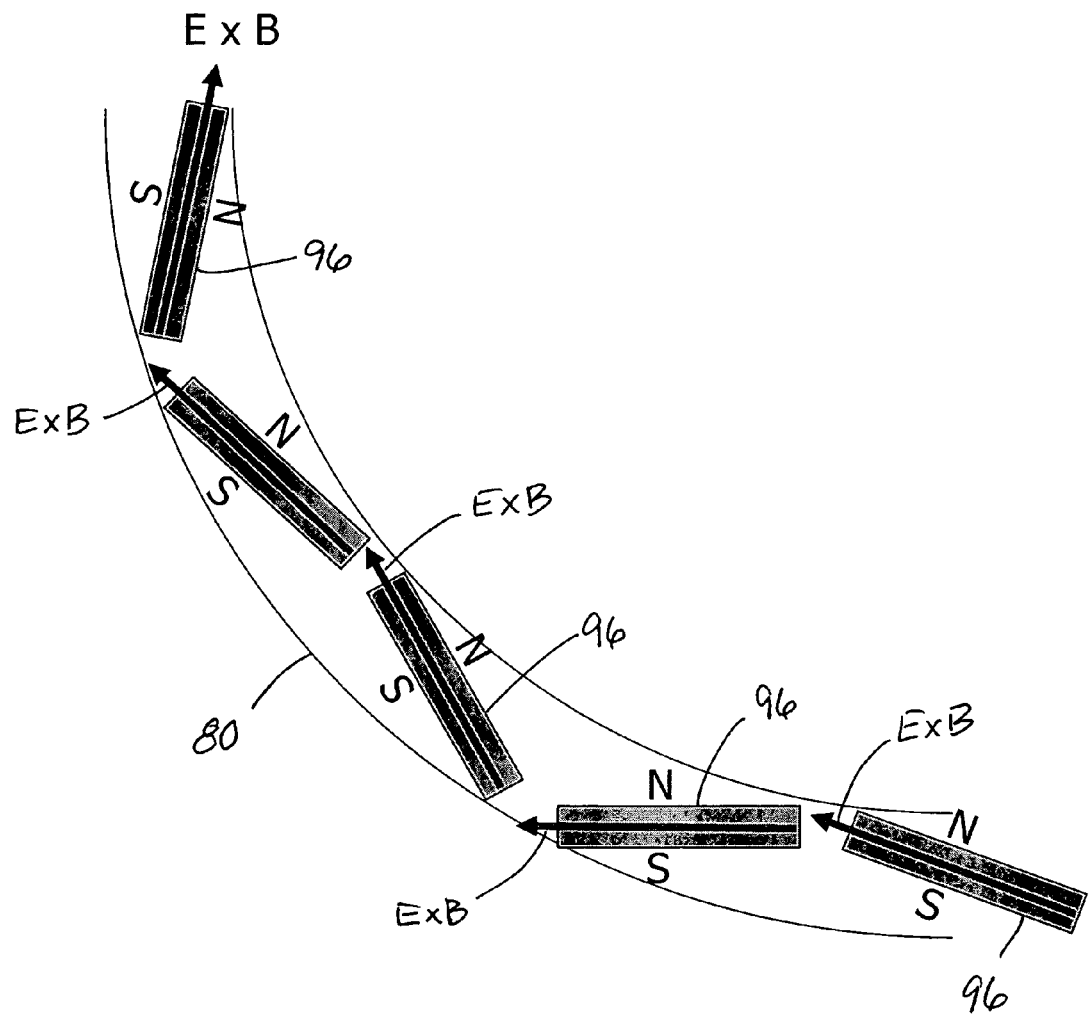
FIG. 7 schematically illustrates an arrangement of magnets below the collecting surface of a Faraday cup.

FIG. 7 schematically illustrates a partial plan view of an arrangement of magnets 96 below the collecting surface 80a of Faraday cup 80, shown in outline in FIG. 7. Magnets 96 can be horizontally oriented, in the manner of magnets 94 of FIG. 6. As shown in FIG. 7, magnets 96 are radially polarized to provide a generally azimuthal force on electrons within Faraday cup 80 (indicated by force lines Ex$\underline{B}$). One or more of magnets 96 can be canted with respect to Faraday cup 80 to provide a radial component to the force indicated by force lines Ex$\underline{B}$. As described above, the radial component can inhibit magnetron-type discharges resulting from azimuthal electron movement within annular Faraday cup 80.

For the illustrative view of FIG. 7, magnets 96 can be alternately canted, though the provision of a radial component to the force acting on the electrons need not be limited by the arrangement shown in FIG. 7. As used herein, the term canted can refer to the force lines of the magnets forming an angle with respect to a tangent to a radius of the Faraday cup 80. For the illustrative view of FIG. 7, pairs of magnets can be canted to form supplementary angles with respect to the tangent. Other arrangements of magnets 96 can be contemplated to provide a radial component to the force at one or more points along annular Faraday cup 80, including canting at non-supplementary angles, canting only a portion of the magnets, alternating polarity of one or more magnets, interspersing magnets generating an azimuthal field $\underline{B}$ among those generating a radial field B, and/or other arrangements contemplated by those of skill in the art.

Figure 8:
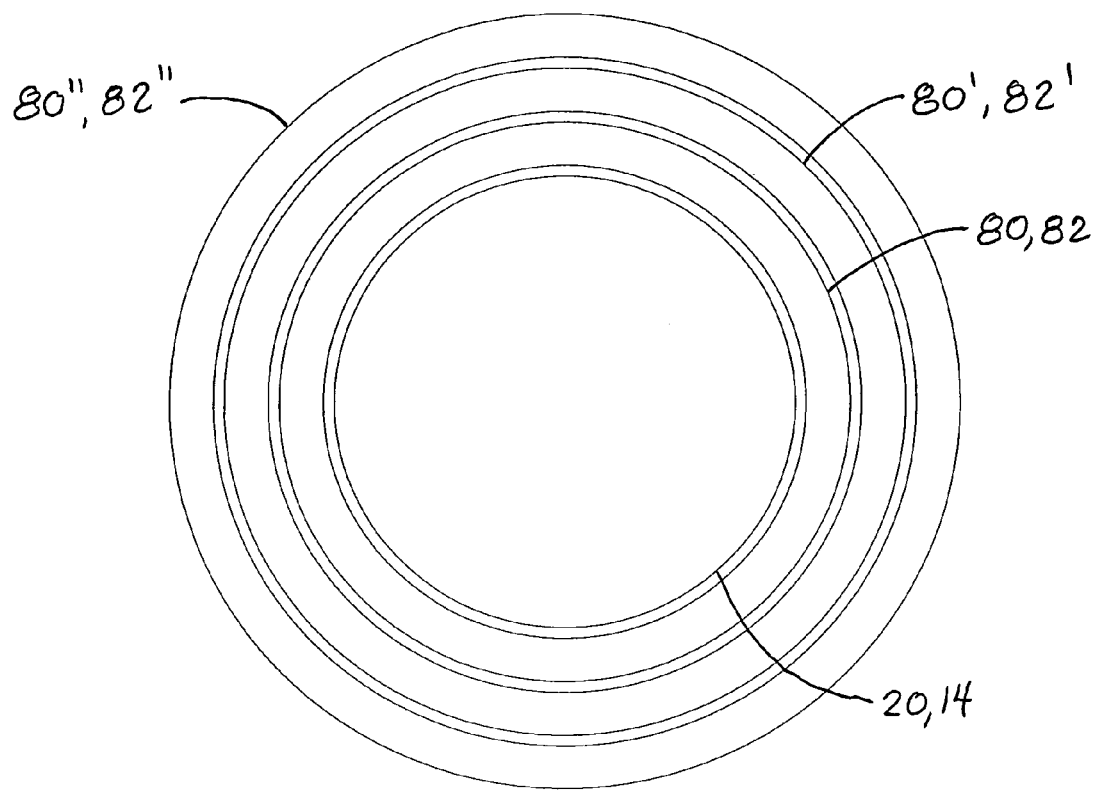
FIG. 8 illustrates a partial schematic plan view of a plasma doping system having multiple annular Faraday cups.

According to a further aspect, two or more annular Faraday cups at different radii can be utilized to obtain a measure of dose uniformity. As used herein, dose uniformity is the uniformity of implanted ions over the surface area of wafer 20. FIG. 8 illustrates a partial schematic plan view, similar to the view of FIG. 2. In this exemplary configuration, plasma doping system 10 can include annular Faraday cups 80' and 80", in addition to Faraday cup 80. For clarity, only the outline of each of the Faraday cups 80, 80' and 80" and their respective shields 82, 82' and 82" are shown in FIG. 8, though the configuration of Faraday cups 80' and 80" and shields 82' and 82" can be as described herein for Faraday cup 80 and shield 82. Differences in the current density at different radii can be used to monitor changes in plasma uniformity. When the dose is not uniform, the Faraday cups 80, 80' and 80" receive different ion currents densities. Accordingly, the current outputs of the Faraday cups may be compared with each other or with a reference to obtain a measure of uniformity. Thus, for example, if one or more of the Faraday cups provide an ion current density that is different from the others, considering normal radial density gradients, non-uniform ion implantation is indicated.

The indication of non-uniform implantation may, for example, be used to control the process, such as by stopping or altering the ion implantation.

Figure 9:
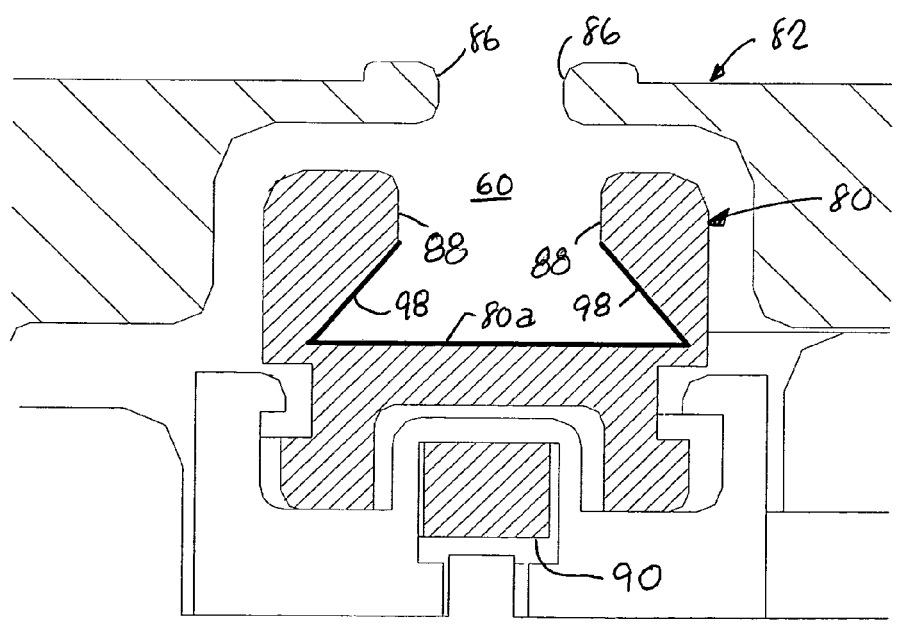
FIG. 9 illustrates a partial schematic cross-sectional view of a Faraday cup having tapered sidewalls.

In the embodiment shown in FIG. 9, the configuration of sidewalls 88 of Faraday cup 80 can be modified to increase the width of collection surface 80a, while maintaining the width of opening 60. The interior of sidewalls 88 can include tapered sidewall portions 98 such that the distance between the sidewalls increases with increasing depth into Faraday cup 80. For illustrative purposes, tapered sidewall portions 98 are shown symmetrically and linearly increasing the distance with depth. However, other configurations of tapered sidewall portions can be contemplated, including asymmetric tapering, non-linear tapering, tapering of one side wall only, and/or tapering of only portions of one or both sidewalls. With increased collection surface 80a, Faraday cup 80 can include increased acceptance of electrons and decreased impact on sidewalls 88.

Figure 10:
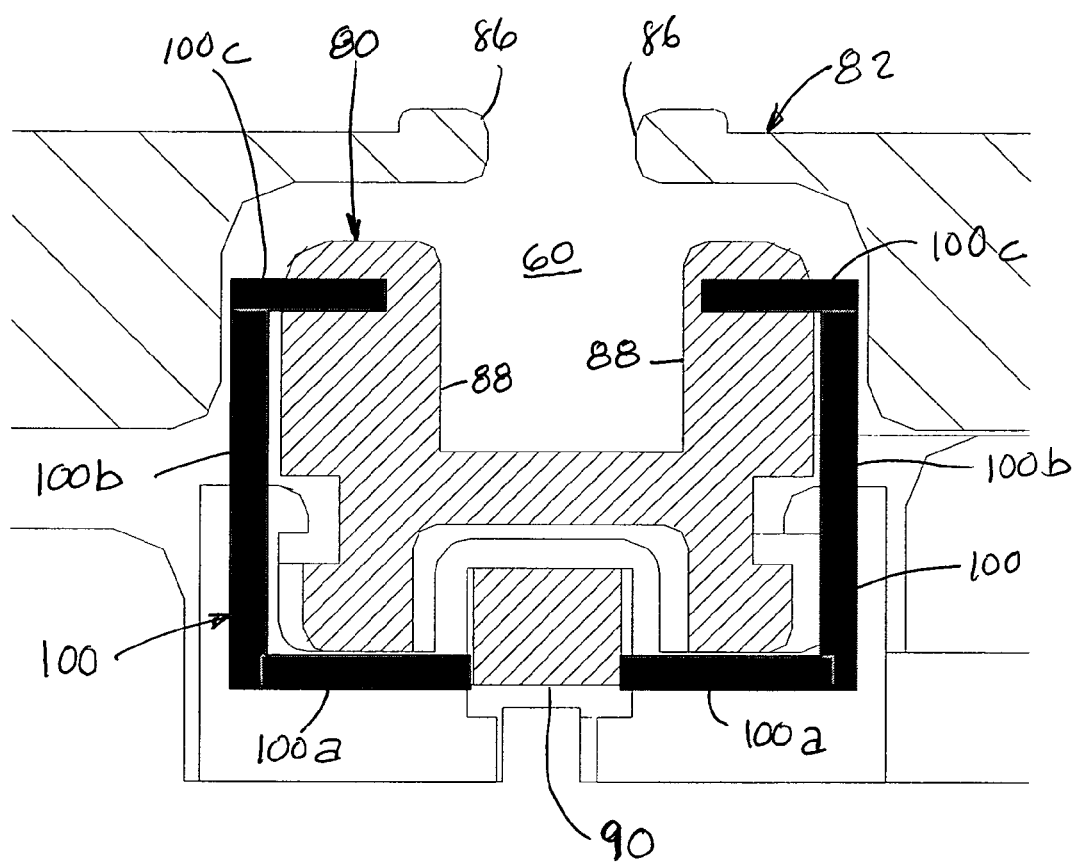
FIG. 10 illustrates a partial schematic cross-sectional view of a Faraday cup having magnetic shielding.

In the embodiment shown in FIG. 10, magnetic shielding 100 can be provided to reduce the magnetic field at the wafer. Shielding 100 can be fabricated of iron, steel, or other material capable of providing the desired magnetic shielding. Depending on the configuration of shielding 100, the magnetic field within Faraday cup 80 can be intensified. For example, shielding 100 can be configured as two channel shapes having lower flanges 100a oppositely extending horizontally from either side of magnets 90 below Faraday cup 80, with webs 100b extending vertically to either side of Faraday cup 80 and upper flanges 100c extending horizontally from webs 100b towards opening 60 of Faraday cup 80. Other configurations, including one or more of the flanges 100a, 100c and/or webs 100b, and other locations of the flanges 100a, 100b and/or webs 100b, e.g., locating webs 100b within sidewalls 88 of Faraday cup 80, or locating upper flanges 100c above Faraday cup 80, can be contemplated.

What has thus been described includes a plasma doping system having a plasma doping chamber, a platen mounted in the plasma doping chamber for supporting a workpiece such as a semiconductor wafer, a source of ionizable gas coupled to the chamber, an anode spaced from the platen and a pulse source for applying high voltage pulses between the platen and the anode. The high voltage pulses can produce a plasma having a plasma sheath in the vicinity of the workpiece. The high voltage pulses accelerate positive ions across the plasma sheath toward the platen for implantation into the workpiece. The plasma doping apparatus can include at least one annular Faraday cup positioned adjacent to and surrounding the platen for collecting a sample of the positive ions accelerated across the plasma sheath. The sample can be representative of the dose of positive ions implanted into the workpiece.

The width and thickness of the aperture and the depth of the Faraday cup can be such as to provide a shallow and narrow Faraday cup, which can reduce discharges within the opening. The ion collection electrode of the Faraday cup can have a continuous cross section, which can eliminate discharges due to azimuthal interruptions. Plasma and implant perturbations can be minimized by using a magnetic suppression field having a very rapid decrease in field strength with distance, which can be accomplished by having the north and south poles in close proximity to each other.

The field can be generally oriented radially across the collection electrode, but the suppression magnets can be offset so as to rotate the radial orientation in opposite directions for adjacent magnets, which can reduce the secondary electron mean free path. The magnetic suppression field can include a field with both radial and azimuthal components, or with primarily azimuthal components. The azimuthal field component can be generated by multiple vertically oriented magnets of alternating polarity, or by the use of a magnetic field coil, e.g., by the use of the return field of a solenoid.

The Faraday aperture can have independently measured openings at different radii. Differences in the current density at different radii can be used to monitor changes in plasma uniformity. The sidewalls of the Faraday cup can be tapered to increase acceptance of electrons and decrease electron impacts on the sidewalls. Magnetic shielding can be provided about the Faraday cup to reduce the magnetic field at the wafer and/or intensify the magnetic field within Faraday cup.

The systems and methods described herein are not limited to a particular hardware or software configuration, and may find applicability in many plasma based ion implantation environments, including continuous wave and pulsed plasma sources. For example, the Faraday cup can be utilized with a number of wafer processing methods, including, but not limited to, hollow cathode pulse generated plasma, wafer bias pulse generated plasma, and/or continuous or pulsed RF, microwave, or other form of generated plasma. The magnetic suppression and/or other techniques described herein for improved Faraday cups monitoring can also be adapted for use with other than the exemplary annular Faraday cups described in the figures, including annular Faraday cups without continuous azimuthal symmetry, and/or discrete Faraday cups positioned about platen 14. In addition, the control of the pulsed current and the dose controller can be implemented in hardware or software, or a combination of hardware and software.

When implemented in software, the methods and systems can be implemented in one or more computer programs, where a computer program can be understood to include one or more processor executable instructions. The computer programs can execute on one or more programmable processors, and can be stored on one or more storage medium readable by the processor (including volatile and non-volatile memory and/or storage elements), one or more input devices, and/or one or more output devices. The processor thus can access one or more input devices to obtain input data, and can access one or more output devices to communicate output data. The input and/or output devices can include one or more of the following: Random Access Memory (RAM), Redundant Array of Independent Disks (RAID), floppy drive, CD, DVD, magnetic disk, internal hard drive, external hard drive, memory stick, or other storage device capable of being accessed by a processor as provided herein, where such aforementioned examples are not exhaustive, and are for illustration and not limitation.

The computer programs preferably can be implemented using one or more high level procedural or object-oriented programming languages to communicate with a computer system; however, the program(s) can be implemented in assembly or machine language, if desired. The language can be compiled or interpreted.

As provided herein, the one or more controllers and/or processors can thus be embedded in one or more devices that can be operated independently or together in a networked environment, where the network can include, for example, a Local Area Network (LAN), wide area network (WAN), and/or can include an intranet and/or the Internet and/or another network. The network(s) can be wired or wireless or a combination thereof and can use one or more communications protocols to facilitate communications between the different processors. The processors can be configured for distributed processing and can utilize, in some embodiments, a client-server model as needed. Accordingly, the methods and systems can utilize multiple processors and/or processor devices, and the processor instructions can be divided amongst such single or multiple processor/devices.

The device(s) or computer systems that integrate with the processor(s) can include, for example, a personal computer (s), workstation (e.g., Sun, HP), personal digital assistant (PDA), handheld device such as cellular telephone, laptop, handheld, or another device capable of being integrated with a processor(s) that can operate as provided herein. Accordingly, the devices provided herein are not exhaustive and are provided for illustration and not limitation.

References to "a processor" or "the processor" can be understood to include one or more processors that can communicate in a stand-alone and/or a distributed environment(s), and can thus can be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network using a variety of communications protocols, and unless otherwise specified, can be arranged to include a combination of external and internal memory devices, where such memory can be contiguous and/or partitioned based on the application. Accordingly, references to a database can be understood to include one or more memory associations, where such references can include commercially available database products (e.g., SQL, Informix, Oracle) and also proprietary databases, and may also include other structures for associating memory such as links, queues, graphs, trees, with such structures provided for illustration and not limitation.

Many additional changes in the details, materials, and arrangement of parts, herein described and illustrated, can be made by those skilled in the art. Accordingly, it will be understood that the following claims are not to be limited to the embodiments disclosed herein, can include practices otherwise than specifically described, and are to be interpreted as broadly as allowed under the law.

What is claimed is:

1. A plasma doping apparatus comprising:
a plasma doping chamber;
a platen mounted in said plasma doping chamber for supporting a workpiece;
a source of ionizable gas coupled to said chamber, said ionizable gas containing a desired dopant for implantation into said workpiece;
a plasma source for producing a plasma having a plasma sheath in the vicinity of said workpiece, said plasma containing positive ions of said ionizable gas, and accelerating said positive ions across the plasma sheath toward said platen for implantation into said workpiece;
an annular Faraday cup disposed around said platen for collecting a sample of said positive ions accelerated across said plasma sheath, said sample being representative of the number of positive ions implanted into the workpiece;
and magnetic field generating means positioned beneath a collecting surface of said Faraday cup to generate a magnetic field at the collecting surface of said Faraday cup for suppressing escape of secondary electrons from said Faraday cup.

2. The apparatus of claim 1, wherein the magnetic field generating means comprises a plurality of vertically aligned magnets of alternating polarity.

3. The apparatus of claim 1, wherein said magnetic field generating means generates a magnetic field oriented azimuthal and generally parallel to said collecting surface for directing said secondary electrons radially towards a sidewall of said Faraday cup.

4. The apparatus of claim 1, wherein the magnetic field generating means comprises a field coil magnet.

5. The apparatus of claim 1, wherein the magnetic field generating means comprises a plurality of horizontally aligned magnets.

6. The apparatus of claim 5, wherein the horizontally aligned magnets have azimuthally alternating polarity to generate the magnetic field having azimuthal components generally parallel to the collecting surface.

7. The apparatus of claim 6, wherein each of the horizontally aligned magnets comprise a pair of magnets horizontally aligned and of the same polarity.

8. The apparatus of claim 1, wherein the magnetic field generating means generates a magnetic field oriented radial and generally parallel to said collecting surface for directing said secondary electrons azimuthally within said Faraday cup.

9. The apparatus of claim 8, wherein the magnetic field generating means generates a magnetic field having an azimuthal component.

10. The apparatus of claim 1, wherein the magnetic field generating means comprises a plurality of horizontally aligned magnets generating a magnetic field oriented radial and generally parallel to the collecting surface, at least one of said plurality of magnets generating a magnetic field having an azimuthal component.

11. The apparatus of claim 10, wherein said at least one of said plurality of magnets generating a magnetic field having an azimuthal component forms an angle with respect to a tangent to a radius of said annular Faraday cup.

12. The apparatus of claim 11, wherein alternating ones of said plurality of magnets form supplementary angles with respect to said tangent.

13. The apparatus of claim 12, further comprising a shield ring disposed around said platen, wherein said Faraday cup is positioned within said shield ring, said shield ring having at least one horizontal projection extending over an opening of said Faraday cup to decrease an effective width of said opening.

14. The apparatus of claim 13, wherein a width of the collecting surface of said Faraday cup is greater than a width of an opening of said Faraday cup.

15. The apparatus of claim 10, wherein said plurality of magnets are alternately canted with respect to a tangent to a radius of said Faraday cup.

16. The apparatus of claim 10, comprising magnetic shielding positioned to reduce the magnetic field generated by the magnetic field generating means at said workpiece and configured to intensify said magnetic field in said Faraday cup.

17. The apparatus of claim 16, wherein said magnetic shielding is configured in the shape of a pair of channels with webs extending generally parallel to sidewalls of said Faraday cup and flanges extending in a direction towards an opening of said Faraday cup.

18. The apparatus of claim 10, comprising magnetic shielding positioned to reduce the magnetic field generated by the magnetic field generating means at said workpiece, wherein said magnetic shielding comprises a pair of plates positioned parallel to sidewalls of said Faraday cup and oppositely about an opening of said Faraday cup.

19. The apparatus of claim 1, further comprising a shield ring disposed around said platen, wherein said Faraday cup is positioned within said shield ring, said shield ring having at least one horizontal projection extending over an opening of said Faraday cup to decrease an effective width of said opening.

20. The apparatus of claim 1, wherein a width of the collecting surface of said Faraday cup is greater than a width of an opening of said Faraday cup.

21. The apparatus of claim 1, wherein a width between sidewalls of said Faraday cup increases with increasing depth in said Faraday cup by tapering at least one of said sidewalls.

22. The apparatus of claim 1, comprising magnetic shielding positioned to reduce the magnetic field generated by the magnetic field generating means at said workpiece.

23. The apparatus of claim 22, wherein said magnetic shielding is configured to intensify said magnetic field in said Faraday cup.

24. The apparatus of claim 23, wherein said magnetic shielding is configured in the shape of a pair of channels with webs extending generally parallel to sidewalls of said Faraday cup and flanges extending in a direction towards an opening of said Faraday cup.

25. The apparatus of claim 23, wherein said magnetic shielding comprises a pair of plates positioned parallel to sidewalls of said Faraday cup and oppositely about an opening of said Faraday cup.

26. In a plasma doping apparatus having a plasma doping chamber, a platen mounted in said plasma doping chamber for supporting a workpiece, a source of ionizable gas coupled to said chamber, said ionizable gas containing a desired dopant for implantation into said workpiece, and a plasma source for producing a plasma having a plasma sheath in the vicinity of said workpiece, said plasma containing positive ions of said ionizable gas, and accelerating said positive ions across the plasma sheath toward said platen for implantation into said workpiece, an improvement to said plasma doping apparatus, comprising:
  an annular Faraday cup disposed around said platen for collecting a sample of said positive ions accelerated across said plasma sheath, said sample being representative of the number of positive ions implanted into the workpiece; and
  a magnetic field generating means positioned beneath a collecting surface of said Faraday cup to generate a magnetic field at the collecting surface of said Faraday cup for suppressing escape of secondary electrons from said Faraday cup.

27. A Faraday cup disposed adjacent a platen in a plasma doping apparatus for collecting a sample of positive ions accelerated across a plasma sheath, said sample being representative of the number of positive ions implanted into a workpiece supported by said platen, said Faraday cup comprising magnetic field generating means positioned beneath a collecting surface of said Faraday cup to generate a magnetic field at the collecting surface of said Faraday cup for suppressing escape of secondary electrons from said Faraday cup.

28. The apparatus of claim 27, wherein the magnetic field generating means comprises a plurality of horizontally aligned magnets generating a magnetic field oriented radial and generally parallel to the collecting surface, at least one of said plurality of magnets generating a magnetic field having an azimuthal component.

29. The apparatus of claim 28, wherein: said Faraday cup is annular; and said at least one of said plurality of magnets generating a magnetic field having an azimuthal component forms an angle with respect to a tangent to a radius of said annular Faraday cup.

30. The apparatus of claim 29, wherein alternating ones of said plurality of magnets form supplementary angles with respect to said tangent.

31. The apparatus of claim 30, further comprising a shield ring disposed around said platen, wherein said Faraday cup is positioned within said shield ring, said shield ring having at least one horizontal projection extending over an opening of said Faraday cup to decrease an effective width of said opening.

32. The apparatus of claim 31, wherein a width of the collecting surface of said Faraday cup is greater than a width of an opening of said Faraday cup.

33. The apparatus of claim 28, wherein:
  said Faraday cup is annular;
  and said plurality of magnets are alternately canted with respect to a tangent to a radius of said Faraday cup.

34. The apparatus of claim 28, comprising magnetic shielding positioned to reduce the magnetic field generated by the magnetic field generating means at said workpiece and configured to intensify said magnetic field in said Faraday cup.

35. The apparatus of claim 34, wherein said magnetic shielding is configured in the shape of a pair of channels with webs extending generally parallel to sidewalls of said Faraday cup and flanges extending in a direction towards an opening of said Faraday cup.

36. The apparatus of claim 28, comprising magnetic shielding positioned to reduce the magnetic field generated by the magnetic field generating means at said workpiece, wherein said magnetic shielding comprises a pair of plates positioned parallel to sidewalls of said Faraday cup and oppositely about an opening of said Faraday cup.

37. In a plasma doping apparatus having a plasma doping chamber, a platen mounted in said plasma doping chamber for supporting a workpiece, a source of ionizable gas coupled to said chamber, said ionizable gas containing a desired dopant for implantation into the workpiece, and a plasma source for producing a plasma having a plasma sheath in the vicinity of said workpiece, said plasma containing positive ions of said ionizable gas, and accelerating said positive ions across the plasma sheath toward said platen for implantation into said workpiece, a method of monitoring a dose of said positive ions implanted into the workpiece, comprising:
  collecting a sample of said positive ions accelerated across said plasma sheath with an annular Faraday cup positioned adjacent to said platen, said sample being representative of a number of positive ions implanted into the workpiece; and
  generating a magnetic field in close proximity to a collecting surface of said Faraday cup to suppress escape of secondary electrons from said Faraday cup with a magnetic field generating means positioned beneath a collecting surface of said Faraday cup.

* * * * *